United States Patent [19]

Long

[11] Patent Number: 5,307,559

[45] Date of Patent: May 3, 1994

[54] METHOD OF PROVIDING A CAPACITOR WITHIN A SEMICONDUCTOR DEVICE PACKAGE

[75] Inventor: Jon Long, Livermore, Calif.

[73] Assignee: LSI Logic Corporation, Milpitas, Calif.

[21] Appl. No.: 979,304

[22] Filed: Nov. 20, 1992

Related U.S. Application Data

[62] Division of Ser. No. 454,751, Dec. 19, 1989, Pat. No. 5,200,642.

[51] Int. Cl.⁵ .............................................. H01R 43/00
[52] U.S. Cl. ....................................... 29/827; 29/25.41; 29/840; 174/52.4; 361/306 DC; 361/306.1
[58] Field of Search ............... 29/25.41, 827, 840; 361/306 DC, 307, 308

[56] References Cited

U.S. PATENT DOCUMENTS

| | | | |
|---|---|---|---|
| 4,491,895 | 1/1985 | Gottlieb et al. | 361/306 DC |
| 4,494,169 | 1/1985 | Watson | 361/306 DC |
| 4,494,170 | 1/1985 | Schilling | 361/306 DC |
| 4,594,641 | 6/1986 | Hernandez | 29/25.42 X |
| 4,705,917 | 11/1987 | Gates, Jr. et al. | 174/52 |
| 4,818,960 | 4/1989 | Satoh et al. | 174/52.4 X |
| 4,860,166 | 8/1989 | Nicolls | 174/52.4 X |
| 4,870,476 | 9/1989 | Solstad . | |
| 4,899,207 | 2/1990 | Hallowell et al. . | |
| 4,903,113 | 2/1990 | Frankeny et al. . | |
| 4,945,399 | 7/1990 | Brown et al. . | |

FOREIGN PATENT DOCUMENTS 2-278708 11/1990 Japan .................................. 361/307

OTHER PUBLICATIONS

Film On Metal Leaded chip Carrier, IBM Technical Disclosure Bulletin, vol. 31, No. 1, Jun. 1988, pp. 2-4.

Primary Examiner—Carl J. Arbes
Attorney, Agent, or Firm—Gerald E. Linden; Michael D. Rostoker

[57] ABSTRACT

A capacitor is disposed within a semiconductor device assembly atop a plastic layer pad, beneath which passes a pair of leads connected to a semiconductor device. The capacitor is connected to the pair of leads, such as by soldering, spot welding or conductive epoxy through cutouts in the pad. In one embodiment, the cutouts extend into the pad from inner and outer edges thereof. In another embodiment, the cutouts are holes through the pad. A plurality, such as four, capacitors are conveniently disposed atop a corresponding plurality of pads, and are connected to a corresponding plurality of pairs of leads within the semiconductor device assembly. By positioning the capacitor(s) as closely to the semiconductor device as possible, the efficacy of the capacitor(s) is maximized. Method and apparatus are disclosed.

18 Claims, 4 Drawing Sheets

METHOD OF PROVIDING A CAPACITOR WITHIN A SEMICONDUCTOR DEVICE PACKAGE

This application is a division of U.S. Pat. Application No.07/454,751 filed Dec. 19, 1989 now U.S. Pat. No. 5,200,642 issued Apr. 6, 1993.

CROSS-REFERENCE TO COPENDING U.S. PATENT APPLICATIONS

Attention is called to commonly-owned, copending U.S. Patent application Ser. No. 115,228, entitled METHOD AND MEANS OF FABRICATING A SEMICONDUCTOR DEVICE PACKAGE filed on Oct. 30, 1987 and commonly-owned, copending U.S. patent application Ser. No. 380,174, entitled STRIP CARRIER FOR INTEGRATED CIRCUITS and filed on Jul. 14, 1989.

TECHNICAL FIELD OF THE INVENTION

The invention relates to a technique for arranging capacitors internally in a semiconductor device assembly (package).

BACKGROUND OF THE INVENTION

As used herein, the term "semiconductor device" refers to a silicon chip or die containing circuitry, and the term "semiconductor device assembly" refers to the semiconductor chip and associated packaging containing the chip, including leads such as for connecting to a socket or a circuit board, and internal connections, such as bond wires, of the chip to the leads.

Commonly-owned U.S. Pat. No. 4,800,419, entitled *SUPPORT ASSEMBLY FOR INTEGRATED CIRCUITS* and filed on Jan. 28, 1987, discloses a composite support assembly for an integrated circuit chip. The support assembly includes a rigid lead frame that is attached to a relatively thin, flexible, tape-like structure. The tape-like structure includes a metallic layer that is etched with inner and outer lead "fingers" allowing for a short pitch, high density arrangement of the lead fingers, thereby enabling bond wires that connect a semiconductor chip to the support assembly to be relatively short. The metallic layer is supported by a segmented plastic film layer, preferably formed of KAPTON (trademark of DuPont Corp.).

Commonly-owned U.S. Pat. No. 4,771,330, entitled *WIRE BONDS AND ELECTRICAL CONTACTS OF AN INTEGRATED CIRCUIT DEVICE* and filed on May 13, 1987, discloses an integrated circuit device package including a rigid frame and flexible tape assembly having wire leads between the die attach pad, conductive lead fingers and the integrated circuit (IC) chip. A dam structure prevents resin flow to ensure proper wire bonding.

Commonly-owned, copending U.S. patent application No. 115,228, entitled *METHOD AND MEANS OF FABRICATING A SEMICONDUCTOR DEVICE PACKAGE* and filed on Oct. 30, 1987, incorporated by reference herein, discloses a semiconductor device assembly having a patterned conductive layer, including a die attach pad and a plurality of leads, and a patterned insulating layer. A semiconductor die is seated on the die attach pad and is connected, such as by bond wires, to the leads. A silicone gel, such as Dow Corning Q1-4939, having a 1 to 10 mixing ratio of curing agent to base, is applied over the bond wires. A body frame, preferably made of a polymer material such as RYTON (trademark of Phillips Chemical Co.) is positioned around the die, and an encapsulant material, such as HYSOL CNB 405-12 (trademark of Hysol) is distributed within the RYTON frame over the semiconductor die and die connections.

Commonly-owned, copending U.S. patent application Ser. No. 380,174, entitled *STRIP CARRIER FOR INTEGRATED CIRCUITS* and filed on Jul. 14, 1989, incorporated by reference herein, discloses a semiconductor device assembly having a patterned conductive layer and a patterned insulating layer, and mounted to a strip carrier (surrogate lead frame) providing mechanical rigidity to the semiconductor device assembly during assembly thereof. After assembly, the packaged semiconductor device assembly is excised from the strip carrier.

The aforementioned patents and applications relate to semiconductor device assemblies having a high (and dense) lead count and that may operate at high speeds. Such high speed semiconductor devices must generally be provided with capacitance across the power leads to ensure noiseless direct current (DC), even when the best of power supplies are provided, since noise can easily be induced onto the power leads by adjacent signal leads. In this regard, the ultimate solution would be to have capacitors (for power lead filtering) located directly on the semiconductor device (chip). Unfortunately, such a solution is not feasable. Therefore, it becomes highly desirable to locate the capacitors as close to the semiconductor device as possible. In this regard, packaging considerations become paramount. Therefore, it has been generally accepted to mount the capacitors external to the semiconductor device assembly, such as within or adjacent a socket into which the semiconductor device assembly is mounted. In real world terms, this means that the capacitors may be located on the order of a half inch or more away from the semiconductor device. Such a "remote", external mounting of the capacitor(s) presents a real limitation to the operating speed of the semiconductor device. Simply put, capacitors located outside the package of the semiconductor device assembly do not help with problems occuring within the package. These problems include stray inductances, ground plane bounce and voltage surges.

In the prior art it has been known to incorporate a relatively large capacitor within in the semiconductor device assembly as part of the die attach pad. However, this solution has a major drawback in that the thermal expansion characteristics of the capacitor are not readily matched to the thermal expansion characteristics of the remaining components of the semiconductor device assembly. Alternatively, it has been known to incorporate a relatively large capacitor on top of the entire semiconductor device assembly. This solution suffers from a tendency to catch on neighboring objects. Neither of these solutions properly solves the problem of getting a capacitor very near to the semiconductor device.

DISCLOSURE OF THE INVENTION

It is therefore an object of the present invention to provide a technique for mounting one or more capacitors internally in a semiconductor device assembly.

It is a further object of the invention to provide an internal capacitor within a semiconductor device assembly that is wire bonded or TAB (tape automated bonding) bonded to a tape carrier.

It is a further object of the invention to arrange one or more capacitors in extremely close proximity to a semiconductor device.

According to the invention, a capacitor is mounted within a semiconductor device assembly in close proximity to the semiconductor die (chip or device). The semiconductor device is lead or TAB bonded to leads which extend from adjacent the device to outside the semiconductor device assembly. Two of these leads are power leads, and extend under a pad formed by a plastic layer disposed atop the leads. Cutouts are provided on the pad allowing for an electrical connection of a capacitor to the power leads. The capacitor is mounted atop the pad and is connected by soldering or spot-welding or by conductive epoxy to the power leads, through the cutouts.

In one embodiment of the invention, the cutouts extend into the pad from the inner and outer edges thereof. A pair of cutouts is aligned with one of the power leads extending under the pad, and another pair of cutouts is aligned with another of the power leads extending under the pad.

In another embodiment of the invention, the cutouts are holes extending through the pad. One set of holes is aligned with one of the power leads extending under the pad, and another set of holes is aligned with another of the power leads extending under the pad.

According to an aspect of the invention, the power leads closely-spaced, parallel and adjacent one another.

According to a further aspect of the invention, a plurality of capacitors are disposed atop a corresponding plurality of pads and connected to a corresponding plurality of power leads.

According to another aspect of the invention, the semiconductor device is supported on a die attach pad, which is part of a patterned metallic layer including a plurality of leads, specific pairs of which are power leads extending outwardly from adjacent a corner of the semiconductor device. A plastic film layer is disposed atop the leads includes various ring portions for supporting the leads, and has corner regions further supporting the leads. Each pair of power leads passes under a respective corner region of the plastic film, which is provided with cutouts for attaching the capacitor to the power leads, such as by soldering, or with an electrically-conductive epoxy adhesive.

The internal capacitor arrangement of the present invention is especially useful in connection with the semiconductor device assemblies of the aforementioned commonly-owned U.S. patents and applications.

The present invention provides a technique for mounting capacitors within the semiconductor device assembly, as close as possible to the semiconductor device itself. The technique of the present invention is "flexible" in that one or more capacitors, nominally four capacitors, are mounted in close proximity to the semiconductor device. Further, in the technique of the present invention, the capacitor(s) are mounted very late in the assembly operation, preferably just prior to final encapsulation of the semiconductor device assembly, which means that capacitorless (and unencapsulated) semiconductor device assemblies can be stockpiled, awaiting the selection and mounting of appropriate capacitors for a particular application.

Other objects, features and advantages of the invention will become apparent in light of the following description thereof.

DETAILED DESCRIPTION OF THE INVENTION

Figure 1A:
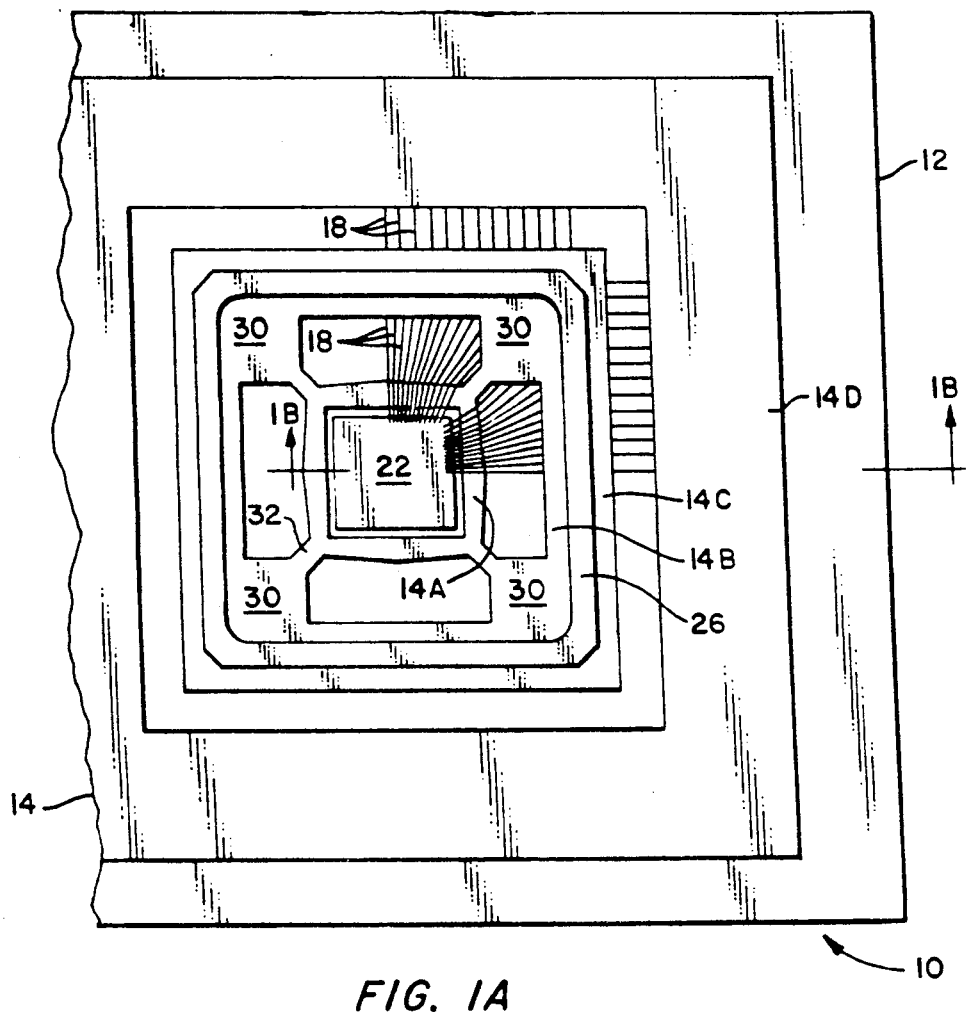
FIG. 1A is a top plan view of a semiconductor device assembly, such as is disclosed in the aforementioned commonly-owned, copending U.S. patent application Ser. No. 380,174.
Figure 1B:
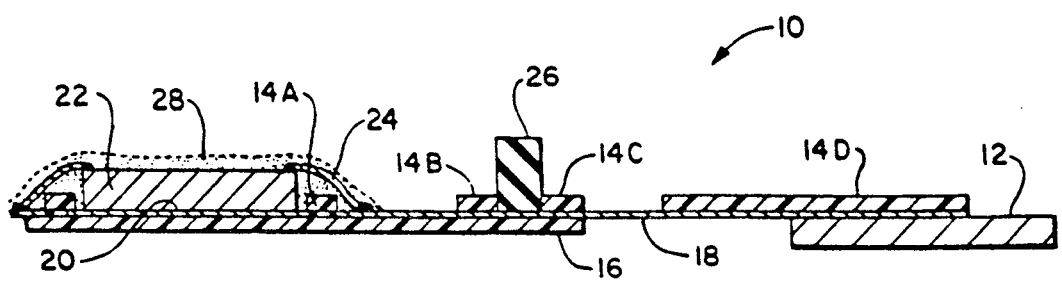
FIG. 1B is a partial cross-sectional view of the semiconductor device assembly of FIG. 1A, taken on the line 1B—1B.
Figure 1C:
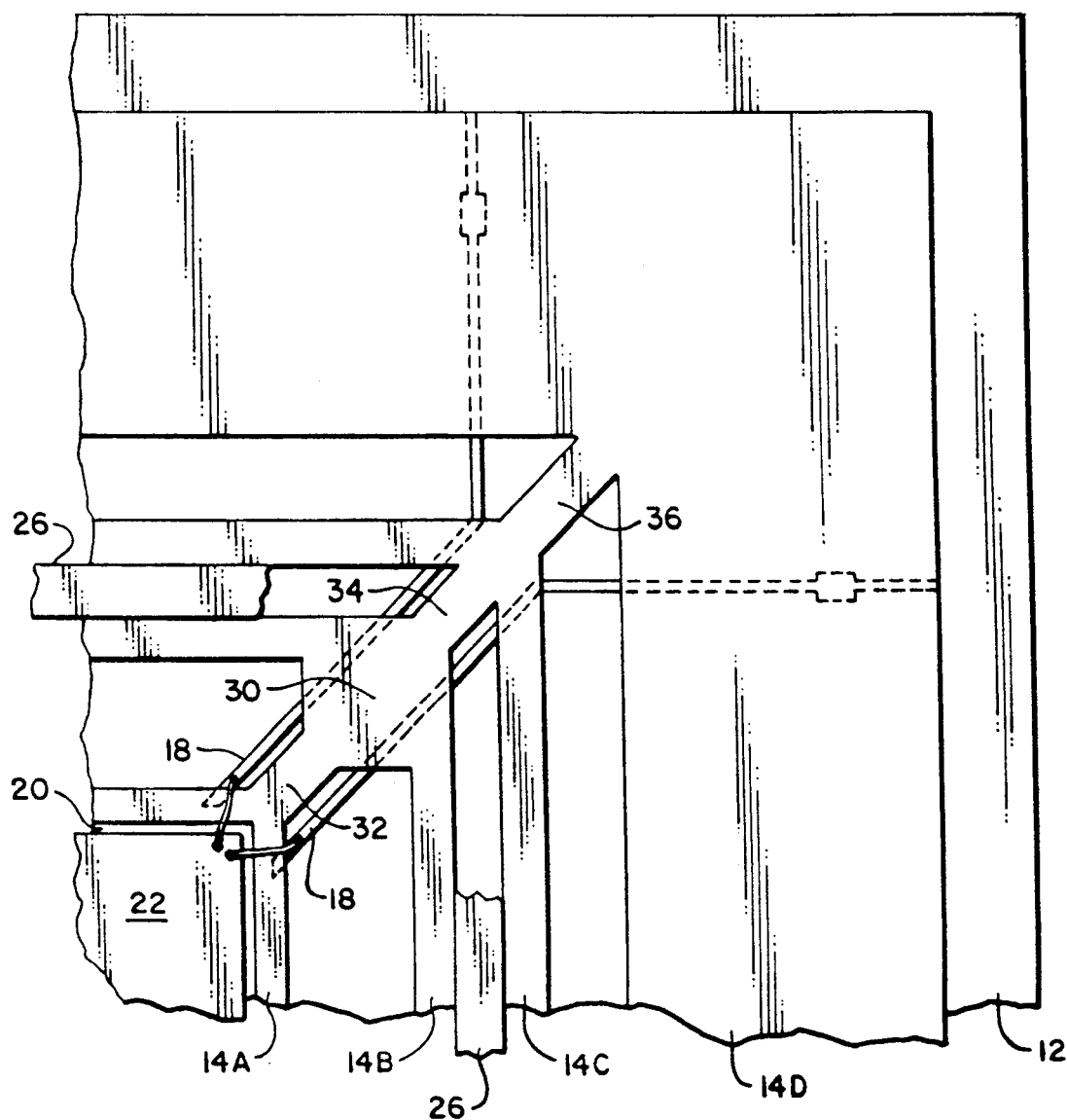
FIG. 1C is a more detailed, partial top plan view of the semiconductor device assembly of FIG. 1A.

FIGS. 1A, 1B and 1C show a semiconductor device assembly 10. Generally, as disclosed in the aforementioned, commonly-owned, copending U.S. patent application Ser. No. 380,174, the semiconductor device assembly 10 includes an upper, segmented plastic film layer 14 (formed of segments 14A, 14B, 14C and 14D), a lower plastic film layer 16, metallic leads 18 sandwiched between the two plastic layers 14 and 16, a metallic (preferably copper) die attach pad 20 supported between the two plastic layers 14 and 16, a semiconductor device 22 mounted on the die attach pad 20 and bond leads 24 connecting the semiconductor device 22 to the leads 18. As disclosed in the aforementioned U.S. patent application Ser. No. 115,228, in lieu of employing bond wires 24, conductive bumps may be employed to provide a conductive path from the device 22 to the leads 18 in a tape automated bonding (TAB) process.

More particularly, the semiconductor device assembly 10 is formed as follows. The upper plastic layer 14 does not form a continuous surface, but rather is segmented to include an inner ring portion 14A, an intermediate ring portion 14B disposed outside of the inner ring portion, an outer ring portion 14C disposed outside of the intermediate ring portion and an exterior ring portion 14D disposed outside of the outer ring portion. The upper plastic layer 14 is preferably formed of KAPTON, and forms a thin, insulating supportive structure for the leads 18. In a region between the inner and intermediate ring portions 14A and 14B, respectively, "inner" portions of the leads 18 are very closely spaced. In a region between the intermediate and exterior ring portions 14B and 14D, respectively, "outer" portions of the leads 18 are more spread out. The inside periphery of the inner ring portion 14A supports the outside periphery of the die attach pad 20, and the outside periphery of the inner ring portion 14A supports the innermost ends of the leads 18, in essence forming a "bridge" between the die attach pad and the leads. A rubber-like or plastic-like ring ("body frame") 26 is disposed atop the leads 18 between the intermediate ring portion 14B and the outer ring portion 14C. The body frame 26 is preferably formed of RYTON, and is joined to the leads 18 by an adhesive, such as a B-stage adhesive such as RT-4B (trademark of RJR Polymers). As shown, a layer-like quantity of silicone gel 28, such as Dow Corning Q1-4939, having a 1 to 10 mixing ratio of curing agent to base, encapsulates the leads 24. The quantity of silicone gel acts as a moisture barrier and a stress relief for the leads 24 during assembly of the semiconductor device assembly, and further prevents an ultimate encapsulation epoxy (not shown) disposed over the semiconductor device in an area defined by the body frame from contacting the semiconductor die. Surface tension between the silicone gel and the leads 24 keeps the silicone gel in place around the leads during assembly of the semiconductor device assembly. The lower plastic layer 16 covers the bottom of the die attach pad 20, and generally over the entire area described by the outer ring portion 14C, on the opposite side of the leads 18 and die attach pad 20. The lower plastic layer 16 is preferably formed of KAPTON.

As disclosed in the aforementioned U.S. patent application Ser. No. 380,174, a surrogate lead frame (edge ring) 12 is provided for handling the semiconductor device assembly during manufacture thereof, and shorts the outer ends of the leads 18 to support the leads and to facilitate electroplating. Further, the semiconductor device assembly is encapsulated with epoxy extending over the semiconductor device 22, bond leads 24 (including the silicone gel layer 28) and inner and intermediate ring portions 14A and 14B, respectively, up to the RYTON ring 26. Further, after completion of the manufacturing process the semiconductor device assembly is excised from the lead frame 12 and exterior ring portion 14D, neither of which properly form any part of the ultimate semiconductor device assembly 10. The RYTON ring 26 also prevents the intermediate KAPTON ring portion 14B from "wicking" moisture into the semiconductor device assembly.

Four corner sections (regions) 30 of the intermediate ring portion 14B are enlarged in area, each extending inwardly toward the inner ring portion 14A and forming a square KAPTON "pad". Further, at each of the four corners of the inner ring portion, a first KAPTON "bridge" 32 is formed connecting the inner ring portion 14A to the intermediate ring portion 14B at a pad 30. Further, at each of the four corners of the intermediate ring portion 14B, a second KAPTON bridge 34 is formed connecting the intermediate ring portion 14B to the outer ring portion 14C. Further, at each of the four corners of the outer ring portion 14C, a third KAPTON bridge 36 is formed connecting the outer ring portion 14C to the exterior ring portion 14D. Ultimately, the second and third KAPTON bridges 34 and 36 may be excised from the semiconductor device assembly, as is illustrated in FIG. 1A.

Figure 2A:
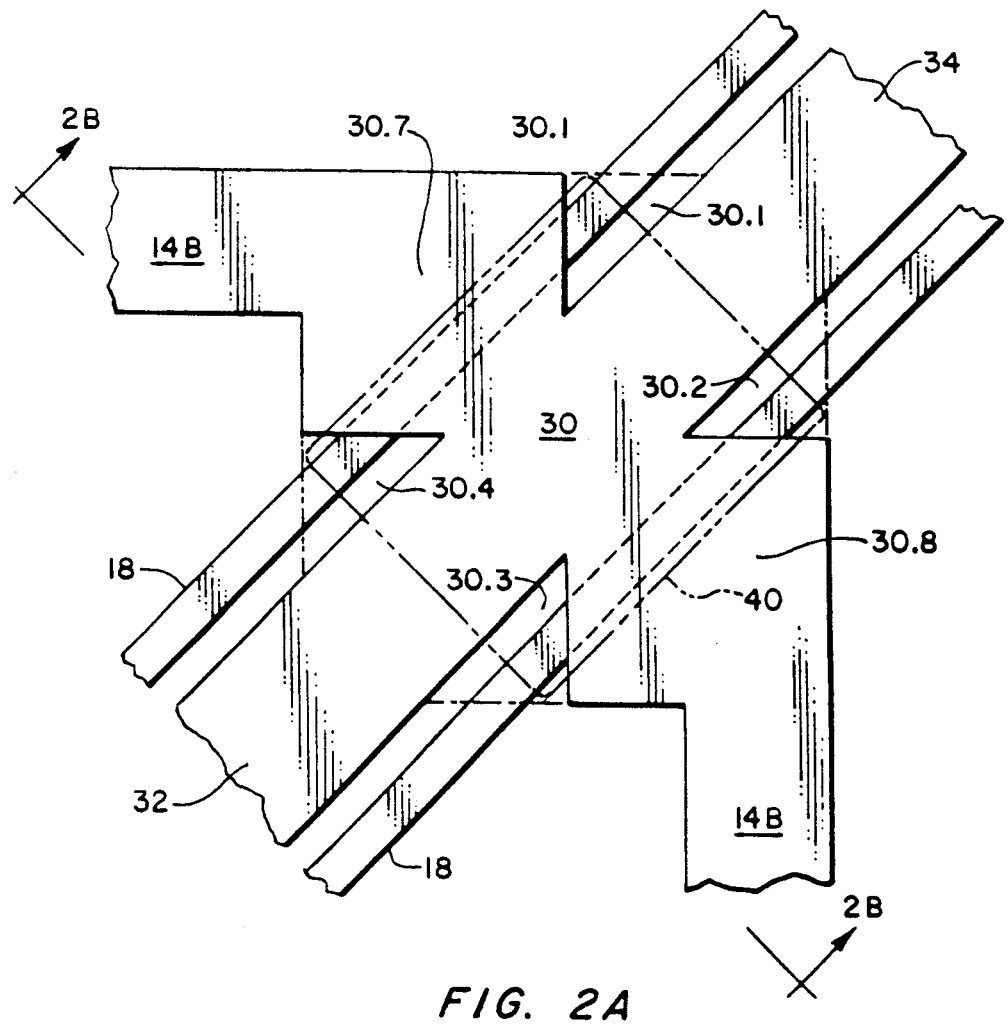
FIG. 2A is a partial top plan view of the internal capacitor for semiconductor device assembly of the present invention.
Figure 3A:
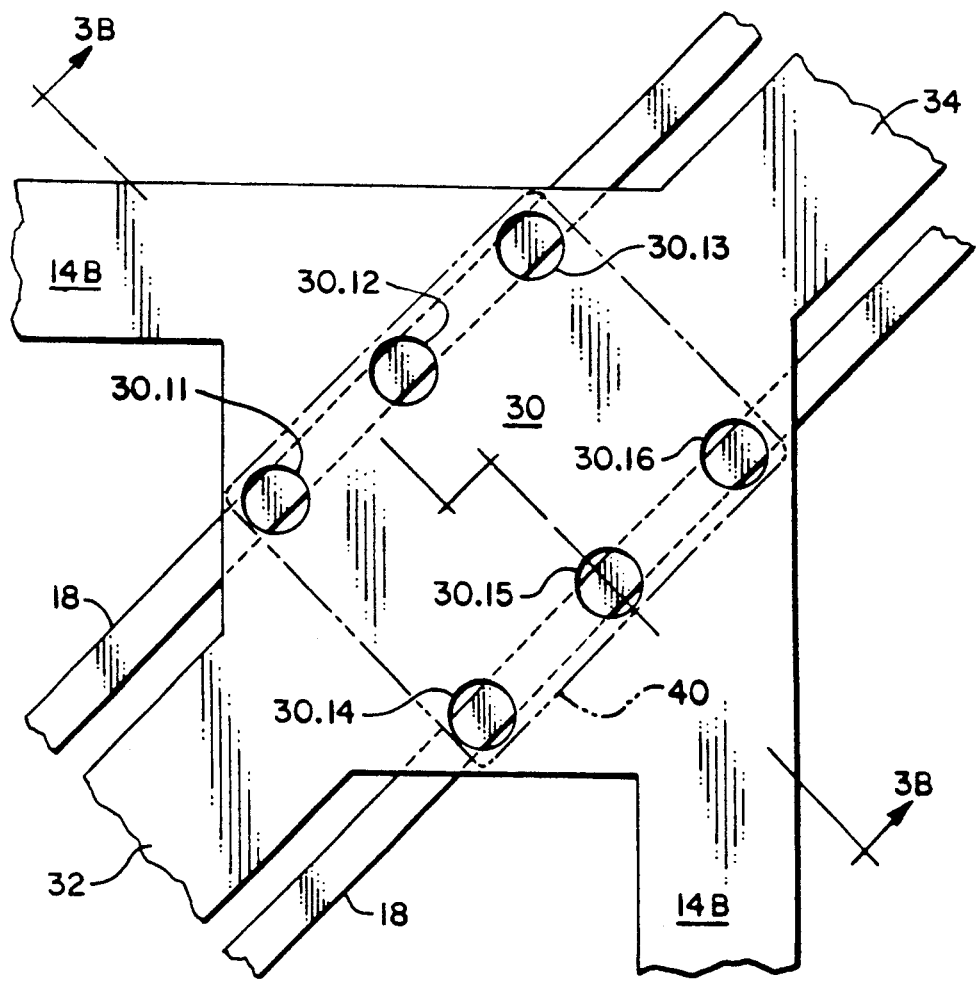
FIG. 3A is a partial top plan view of an alternate embodiment of the internal capacitor for semiconductor device assembly of the present invention.

With particular attention to FIG. 1C, two cornermost leads 18 (as shown in FIG. 1C) radiate (extend) outwardly from each of the four corners of the die 22 (as attached by corresponding bond leads 24, passing underneath the four corner regions 30 (one corner region 30 illustrated in FIGS. 1C, 2A and 3A). These two cornermost leads 18 would typically carry power to the semiconductor device 22, and the pattern of two corner leads 18 carrying power to the device is repeated four times, once at each corner of the semiconductor device assembly, since power levels typically exceed signal levels for semiconductor devices.

It should be noted that the pair of power leads do not have to be adjacent, because the pads (30) are insulating. There may be other, non-power leads passing between the pair of power leads.

Figure 2B:
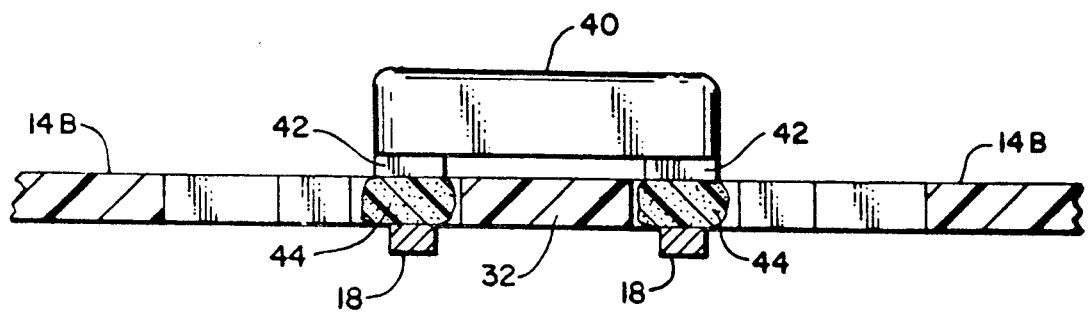
FIG. 2B is a cross sectional view of the internal capacitor arrangement of FIG. 2A, taken on section line 2B—2B through FIG. 2A.

First Embodiment (FIGS. 2A and 2B)

FIGS. 2A and 2B shows an embodiment of the internal capacitor arrangement for semiconductor device assembly of the present invention.

As discussed with reference to FIGS. 1A, 1B and 1C, the semiconductor device assembly includes an upper, segmented plastic film layer 14 (including portions 14A, 14B, 14C and 14D), a lower plastic film layer 16, metallic leads 18 sandwiched between the two plastic layers 14 and 16, a metallic die attach pad 20 supported between the two plastic layers 14 and 16, a semiconductor device 22 mounted atop the die attach pad 20 and bond leads 24 connecting the semiconductor device 22 to the leads 18.

As further discussed with reference to FIGS. 1A, 1B and 1C, the upper plastic layer 14 does not form a continuous surface, but rather is segmented to include an inner ring portion 14A, an intermediate ring portion 14B disposed outside of the inner ring portion and an outer ring portion 14C disposed outside of the intermediate ring portion. The upper plastic layer 14 is preferably formed of KAPTON. The inside periphery of the inner ring portion 14A supports the outside periphery of the die attach pad 20, and the outside periphery of the inner ring portion 14A supports the innermost ends of the leads 18. A rubber-like or plastic-like ring 26, preferably formed of RYTON, is disposed atop the leads 18 between the intermediate ring portion 14B and the outer ring portion 14C. A layer-like quantity of silicone gel 28 encapsulates the leads 24, and the semiconductor device assembly is eventually encapsulated with "gloptop" epoxy.

Of the above-described elements of the semiconductor device assembly, only the intermediate ring portion 14B, some of the leads 18, and the KAPTON pad 30 are illustrated in FIGS, 2A and 2B. Further, the "bridges" 32 and 34 are illustrated.

Directing attention now to the KAPTON pad 30, four pads 30 (one pad illustrated) are disposed in the semiconductor device assembly just inside the four interior corners of the body frame (RYTON ring) 26. A pair of (two) leads 18 pass directly underneath each pad 30. These two leads 18 carry power (typically VDD and VSS) to the semiconductor device 22. (The remaining intermediate leads 18, illustrated in FIG. 1A, which may number in the hundreds, carry signals to and from the semiconductor device.) For each of the four pads in the semiconductor device assembly, a pair of power leads pass directly underneath a corresponding pad.

Each pad 30 is provided with four outouts 30.1, 30.2, 30.3 and 30.4, which are arranged as follows. The cutout 30.1 extends into the pad 30 from the outside edge of the intermediate ring portion 14B, from one side of the bridge 34. The cutout 30.2 extends into the pad 30 from the outside edge of the intermediate ring portion 14B, from an opposite side of the bridge 34. The cutout 30.3 extends into the pad 30 from an inside edge of the intermediate ring portion 14B, from one side of the bridge 32. The cutout 30.4 extends into the pad 30 from an inside edge of the intermediate ring portion 14B, from an opposite side of the bridge 32. The cutouts 30.1 and 30.4 are aligned along the extent of one of the pair of power leads 18, and the cutouts 30.2 and 30.3 are aligned along the extent of another of the pair of power leads 18.

A capacitor 40 is disposed atop the pad 30, and has a body portion and two conductive legs 42. The capacitor 40 is a readily available "chip" capacitor. The capacitor 40 is sized and oriented so that the each of the conductive legs are aligned with one of the pair of power leads 18. As best viewed in FIG. 2A, each of the conductive legs 42 is spaced from a corresponding power lead 18 by the thickness of the KAPTON pad 30. In order to effect a connection between a power lead 18 and a respective conductive leg 42, the void formed by the cutouts aligned with the power lead is filled with conductive epoxy 44. Alternatively, the conductive leg 42 is connected to the respective power lead by soldering or spot welding.

As mentioned hereinbefore, the capacitor 40 is a readily-available chip capacitor. Preferably, the capacitor has a low inductance characteristic. An inportant advantage of the internal capacitor arrangement of the present invention is that four capacitors can be arranged symmetrically about the semiconductor device, and that the capacitors are well protected within the semiconductor device assembly package. The invention also has utility in connection with bridging multiple semiconductor devices within a single package.

Figure 3B:
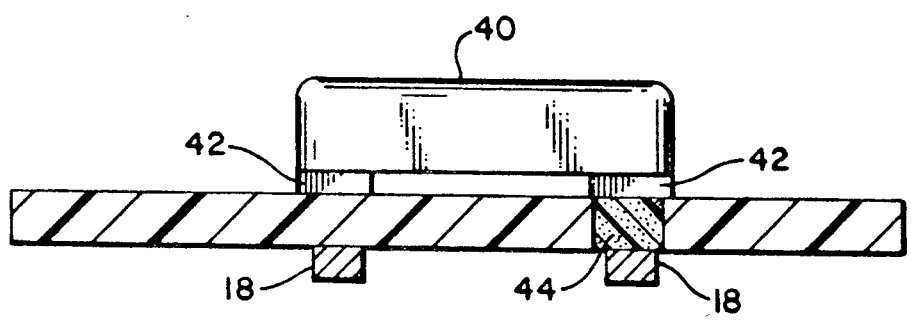
FIG. 3B is a cross sectional view of the internal capacitor arrangement of FIG. 3A, taken on section line 3B—3B through FIG. 3A.

Second Embodiment (FIGS. 3A and 3B)

FIGS. 3A and 3B show an alternate embodiment of the internal capacitor arrangement for semiconductor chip assembly of the present invention. This embodiment differs from the previously-discussed embodiment (of FIGS. 2A and 2B) primarily with respect to the shape and configuration of the cutouts in the pad 30. Ultimately, the arrangement of the capacitor 40 is the same as that previously discussed in that the two conductive legs 42 are connected to the pair of power leads 18, such as by conductive epoxy filling voids left by the cutouts in the pad 30. Again, it is anticipated that four capacitors will be arranged within the semiconductor device assembly, each capacitor residing atop a pad underneath which passes two leads powering the semiconductor device.

Each pad 30 is provided with a plurality of cutouts 30.11, 30.12, 30.13, 30.14, 30.15 and 30.16, which are arranged as follows. The cutouts 30.11, 30.12 and 30.13 are simply holes disposed in the pad 30 along the extent of one of the pair of power leads 18. The cutouts 30.14, 40.15 and 30.16 are simply holes disposed in the pad 30 along the extent of another of the pair of power leads 18.

It should be understood that the capacitor (40) is any suitable edge-contact type chip capacitor. Typically, the legs (42) are simply conductive regions disposed along two opposing edges of the capacitor, and do not protrude as significantly as illustrated. A generally flat, edge-contact chip capacitor is suitable. The important feature is that the "legs" (conductive regions) of the capacitor line up with the cutouts (e.g., 30.1–30.4 or 30.11–30.16) for making contact with a pair of leads (18).

What is claimed is:

1. A method of providing a capacitor within a semiconductor device package, comprising:
providing an upper plastic film layer above conductive leads, a portion of the plastic film layer forming a plastic film pad stop a pair of the leads;
disposing a capacitor atop the plastic film pad, on an opposite side of the plastic film pad from the leads; and
connecting the capacitor through the plastic film pad to the pair of leads.

2. Method, according to claim 1, further comprising:
forming cutouts through the plastic film pad for connecting the capacitor to the pair of leads.

3. Method, according to claim 1, further comprising:
providing a die attach pad in-plane with the leads, the leads fanning out from the die attach pad; and
disposing a semiconductor die atop the die attach pad, on the same side of the leads as the upper plastic film layer.

4. Method, according to claim 3, wherein:
the upper film layer is segmented to have gaps; and further comprising:
connecting the semiconductor die to the leads through the position of the gaps.

5. Method, according to claim 4, wherein:
the upper film layer is segmented into a series of rings surrounding the semiconductor die; and
the semiconductor die is connected to the leads through a gap between two adjacent rings.

6. Method, according to claim 5, wherein:
the pad is a portion of one of the rings.

7. Method, according to claim 6, wherein:
the rings are square rings; and
the pad is a corner portion of one of the square rings.

8. Method, according to claim 1, further comprising:
encapsulating inner portions of the leads, inner portions of the upper plastic film layer, and the capacitor.

9. Method, according to claim 3, further comprising:
encapsulating inner portions of the leads, inner portions of the upper plastic film layer, the capacitor and the semiconductor die.

10. Method of forming a semiconductor device assembly comprising:
mounting a semiconductor device to a die attach pad, wherein the die attach pad is generally coplanar with a plurality of leads extending generally radially in a plane from the semiconductor device, wherein a pair of the leads are power leads;
providing a plastic film layer having two opposing surfaces atop the leads, wherein the semiconductor device extends above one surface of the plastic film layer and the leads are disposed on the opposite surface of the plastic film layer;
forming a pad as a portion of the plastic film layer, the pad being disposed atop the pair of power leads;
providing cutouts extending through the pad in alignment with the pair of power leads; and
disposing a capacitor atop the pad on a surface of the plastic film layer opposite the leads, the capacitor having two conductive legs, both of which are connected through the cutouts to the pair of power leads.

11. Method, according to claim 10, wherein:
the cutouts extend into the pad from inner and outer edges thereof.

12. Method, according to claim 10, wherein:
the cutouts are holes disposed through the pad.

13. Method, according to claim 10, wherein:
the power leads are closely-spaced, parallel and adjacent one another.

14. Method, according to claim 10, further comprising:

connecting the capacitor to the power leads by conductive epoxy.

15. Method, according to claim 10, further comprising:
    connecting the capacitor to the power leads by soldering or spot-welding.

16. Method, according to claim 10, further comprising:
    providing a plurality of pairs of power leads, a corresponding plurality of pads and a corresponding plurality of capacitors.

17. Method of forming a semiconductor device assembly comprising:
    providing an upper plastic film layer;
    providing a lower plastic film layer;
    sandwiching metallic leads between the upper and lower plastic film layers;
    supporting a die attach pad between the upper and lower plastic film layers;
    mounting a semiconductor chip to the die attach pad;
    connecting the semiconductor chip to the leads; and
    disposing a capacitor on a surface of the upper plastic film layer, opposite the leads, the capacitor having two conductive legs connected to two of the leads.

18. Method, according to claim 17, further comprising:
    providing a plurality of pairs of power leads and a corresponding plurality of capacitors connected to the pairs of power leads.

* * * * *